US009748948B2

(12) United States Patent
Phadke

(10) Patent No.: US 9,748,948 B2
(45) Date of Patent: Aug. 29, 2017

(54) METHODS FOR OVERDRIVING A BASE CURRENT OF AN EMITTER SWITCHED BIPOLAR JUNCTION TRANSISTOR AND CORRESPONDING CIRCUITS

(71) Applicant: Astec International Limited, Kowloon (HK)

(72) Inventor: Vijay Gangadhar Phadke, Pasig (PH)

(73) Assignee: ASTEC INTERNATIONAL LIMITED, Kwun Tong, Kowloon (HK)

( * ) Notice: Subject to any disclaimer, the term of this patent is extended or adjusted under 35 U.S.C. 154(b) by 0 days.

(21) Appl. No.: 15/394,290

(22) Filed: Dec. 29, 2016

(65) Prior Publication Data

US 2017/0111041 A1    Apr. 20, 2017

Related U.S. Application Data

(63) Continuation of application No. 14/559,597, filed on Dec. 3, 2014, now Pat. No. 9,571,091.

(60) Provisional application No. 61/913,070, filed on Dec. 6, 2013.

(51) Int. Cl.
*H03K 17/60* (2006.01)

(52) U.S. Cl.
CPC ................... *H03K 17/60* (2013.01)

(58) Field of Classification Search
CPC ... H03K 17/60; H02M 3/158; H01L 27/0251; H02H 3/20; G01R 31/025; G01R 19/00
USPC .... 327/108, 109, 110, 111, 112; 363/55, 56, 363/132, 140
See application file for complete search history.

(56) References Cited

U.S. PATENT DOCUMENTS

| | | | | |
|---|---|---|---|---|
| 5,107,151 A | * | 4/1992 | Cambier | H03K 17/08142 327/432 |
| 5,528,192 A | | 6/1996 | Agiman | |
| 7,053,678 B2 | * | 5/2006 | Scollo | H03K 17/567 327/108 |
| 7,218,164 B2 | | 5/2007 | Vitale et al. | |
| 7,449,935 B2 | | 11/2008 | Scollo et al. | |
| 7,573,730 B2 | * | 8/2009 | Chuang | H02J 7/0052 363/20 |
| 7,649,401 B2 | | 1/2010 | Scollo et al. | |
| 8,723,558 B2 | | 5/2014 | Zhai et al. | |
| 2012/0319742 A1 | | 12/2012 | Zhai et al. | |
| 2015/0162833 A1 | * | 6/2015 | Phadke | H02M 3/158 323/271 |

(Continued)

*Primary Examiner* — John Poos
(74) *Attorney, Agent, or Firm* — Harness, Dickey & Pierce, P.L.C.

(57) ABSTRACT

An emitter switched bipolar transistor circuit includes a bipolar junction transistor (BJT) having a collector coupled to an output terminal, a metal oxide semiconductor field effect transistor (MOSFET) coupled to an emitter of the BJT, a bias voltage supply coupled to the base of the BJT, a buffer coupled to the base of the BJT, and a comparator. The comparator includes a first input coupled to the collector of the BJT, a second input coupled to a voltage reference, and an output coupled to an input of the buffer. The comparator is configured to receive a collector voltage of the BJT at the first input of the comparator, compare the received collector voltage with the voltage reference, and cause the buffer to inject a current pulse to the base of the BJT until the collector voltage is less than the voltage reference, indicating the BJT is substantially saturated.

7 Claims, 7 Drawing Sheets

(56) References Cited

U.S. PATENT DOCUMENTS

2015/0340355 A1* 11/2015 Zhang .................... G01R 19/00
361/86

* cited by examiner

METHODS FOR OVERDRIVING A BASE CURRENT OF AN EMITTER SWITCHED BIPOLAR JUNCTION TRANSISTOR AND CORRESPONDING CIRCUITS

CROSS-REFERENCE TO RELATED APPLICATION

This application is a continuation of U.S. application Ser. No. 14/559,597 filed Dec. 3, 2014, which claims the benefit of U.S. Provisional Application No. 61/913,070 filed Dec. 6, 2013. The entire disclosures of the above applications are incorporated herein by reference.

FIELD

The present disclosure relates to methods for overdriving a base current of an emitter switched bipolar junction transistor and corresponding circuits.

BACKGROUND

This section provides background information related to the present disclosure which is not necessarily prior art.

FIG. 1 illustrates a prior art emitter switched bipolar transistor. Such circuit arrangements may have higher switching speeds comparable with MOSFETS, have lower saturation voltages for high voltage applications, and may be lower in cost. They may be used in power chargers or adapters. The low voltage MOSFET Q2 is controlled by the high frequency PWM control signal and turns on or off current flowing through the emitter of the BJT Q1. The BJT is driven by a fixed base drive appropriate for on-time operation based upon gain characteristics of the device.

Switching BJTs may take a long time for the collector voltage to fall after applying a base current, which may lead to higher turn on losses as the collector current starts to build while the BJT is still in linear mode. A large base current overdrive may be used to turn on the BJT and saturate it rapidly to enhance turn on performance.

FIG. 2 illustrates a prior art emitter switched bipolar transistor having a capacitor C1 coupled to the base of the BJT Q1. When a BJT is driven at a base current higher than necessary to keep it in saturation, excess base drive energy is stored in the base region, which may cause slower turn off and energy loss due to over drive. In operation, when the control MOSFET Q2 turns off, emitter current of the BJT Q1 is turned off rapidly and the collector current diverts out of the base till all storage charge is removed. The capacitor C1 may be used to recover storage charge and use it in a regenerative manner. The collector current coming out of the base in a reverse direction charges capacitor C1. Therefore, after turn off, the voltage on capacitor C1 may be higher than the bias voltage supply V1. During the next turn on instance, a base current pulse may be delivered by energy stored in capacitor C1 through resistor R1. A zener diode Z1 may be used to limit the voltage on capacitor C1.

FIG. 3 illustrates a prior art emitter switched bipolar transistor having a current transformer TX1 to provide a proportional base drive current. The storage energy returned by diverting collector current out of the base is used to charge capacitor C1 to a desired voltage level. The voltage level may vary depending upon the stored energy in the base region, parametric variations and the value of the capacitor C1. The voltage may be limited by the zener diode ZD1, which may dissipate the remaining energy when its break down voltage is exceeded.

Each of the above prior art circuits require a capacitor storage element and thus cannot be implemented in an integrated circuit.

FIG. 4 illustrates a prior art power converter having an emitter switched bipolar transistor. The power converter is a typical buck converter with a control switch placed on the low side of the DC input. Bias supply voltage V1 is a high voltage input DC source. The emitter switched bipolar transistor comprises switches Q1 and Q2. Diode D1 is a freewheeling diode. Inductor L1 is a buck output inductor. Capacitor C1 is a filter capacitor. Various parasitic capacitances are also illustrated: C2 is the control MOSFET's (Q2's) drain to source capacitance; C3 is the BJT's (Q1's) collector emitter capacitance; C4 is the inter-winding shunt capacitance of the inductor L1; C5 is the body capacitance of the freewheeling diode; C6 represents any parasitic capacitance from collector to return.

SUMMARY

This section provides a general summary of the disclosure, and is not a comprehensive disclosure of its full scope or all of its features.

According to one aspect of the present disclosure, a method of overdriving a base current of an emitter switched bipolar junction transistor (BJT) is disclosed. The BJT includes a base, a collector and an emitter. The method includes supplying a current to the base of the BJT, monitoring a voltage at the collector, and reducing the current supplied in response to the monitored voltage of the collector decreasing to a voltage threshold indicating the BJT is substantially saturated.

According to another aspect of the present disclosure, a method of overdriving a base current of an emitter switched bipolar junction transistor (BJT) is disclosed. The BJT includes a base, a collector and an emitter. The method includes supplying a first current to the base of the BJT, and supplying a second current to the base of the BJT for only a fixed period of time.

According to another aspect of the present disclosure, an emitter switched bipolar transistor circuit includes a bipolar junction transistor (BJT) having a collector coupled to an output terminal, a metal oxide semiconductor field effect transistor (MOSFET) coupled to an emitter of the BJT, a bias voltage supply coupled to the base of the BJT, a buffer coupled to the base of the BJT, and a comparator. The comparator includes a first input coupled to the collector of the BJT, a second input coupled to a voltage reference, and an output coupled to an input of the buffer. The comparator is configured to receive a collector voltage of the BJT at the first input of the comparator, compare the received collector voltage with the voltage reference, and cause the buffer to inject a current pulse to the base of the BJT until the collector voltage is less than the voltage reference, indicating the BJT is substantially saturated.

According to another aspect of the present disclosure, a BJT base current overdriving circuit includes a bipolar junction transistor (BJT) having a collector coupled to an output terminal, a metal oxide semiconductor field effect transistor (MOSFET) coupled to an emitter of the BJT, a bias voltage supply coupled to the base of the BJT, and a buffer. The buffer includes an input coupled to the collector of the BJT and the bias voltage supply, and an output coupled to the base of the BJT. The buffer is configured to inject a current pulse to the base of the BJT until the collector voltage of the BJT is less than a voltage threshold of the buffer, indicating the BJT is substantially saturated.

According to another aspect of the present disclosure, a power converter control circuit includes a bipolar junction transistor (BJT) having a base, a collector and an emitter. The power converter control circuit also includes a metal oxide semiconductor field effect transistor (MOSFET) coupled to the emitter, a bias voltage supply coupled to the base, a buffer coupled to the base, and a controller coupled to the gate of the MOSFET. The controller is configured to apply a pulse width modulated (PWM) signal to control the MOSFET. The power converter control circuit also includes a timer element coupled between the controller and an input of the buffer. The timer element is configured to, in response to receiving a control signal from the controller to turn on the MOSFET, cause the buffer to inject a current pulse to the base for a fixed period of time. The fixed period of time is selected such that the current pulse will substantially saturate the BJT.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 6:
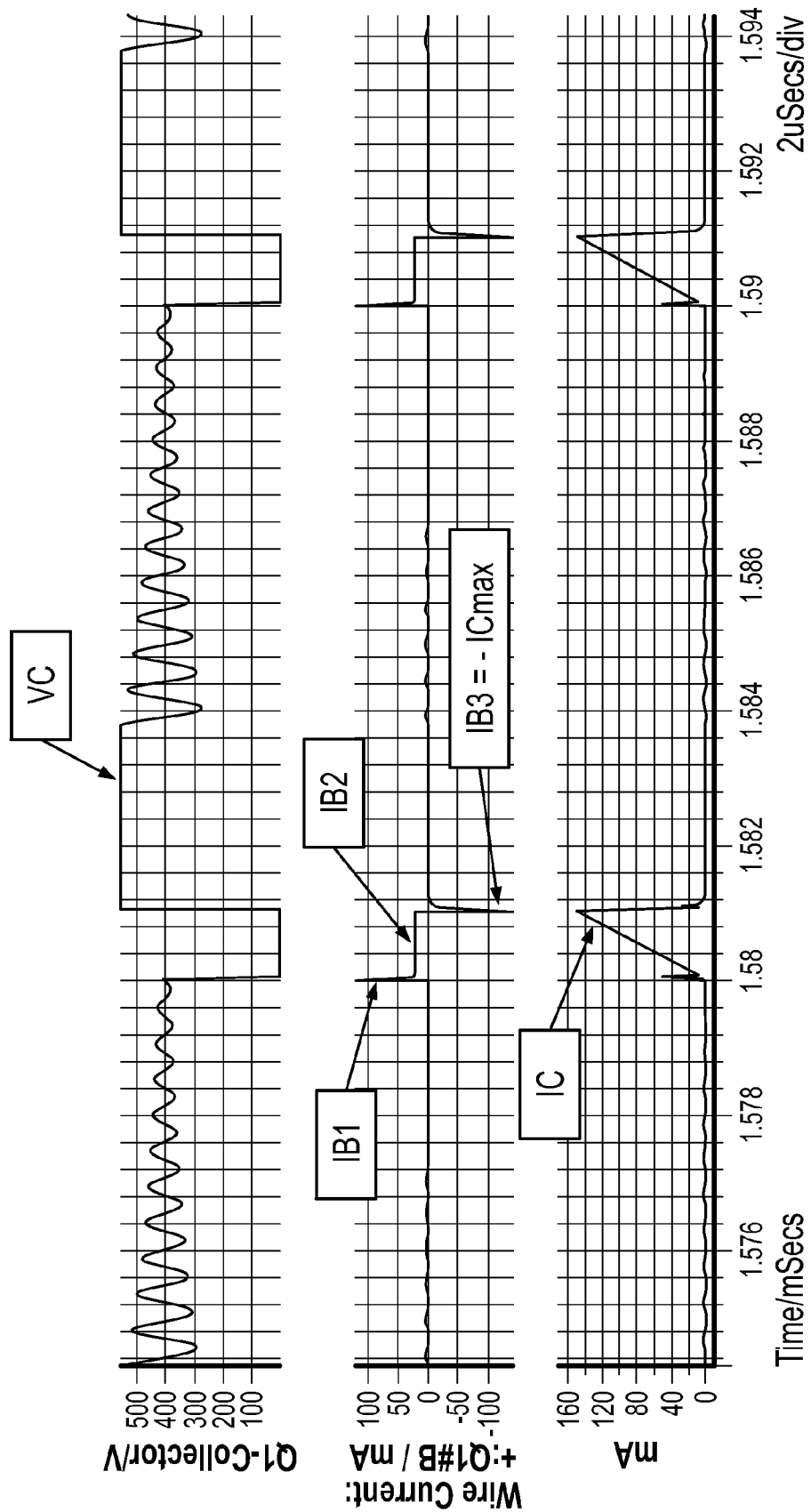

FIGS. 6A-C are example exploded waveforms of various voltages and currents of the BJT during operation.

Figure 7:
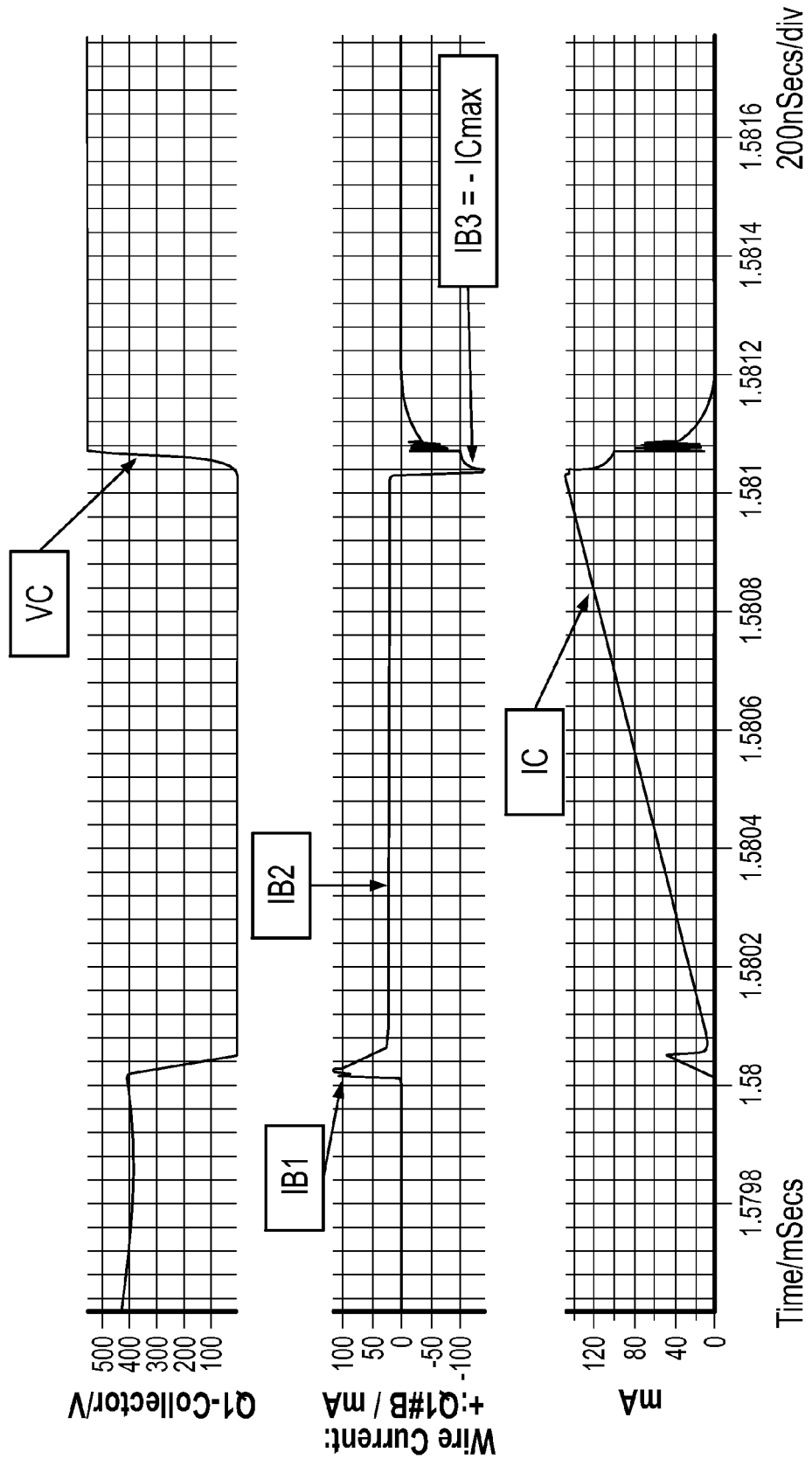

FIGS. 7A-C illustrate a single cycle of the waveforms of FIGS. 6A-C.

Figure 8:
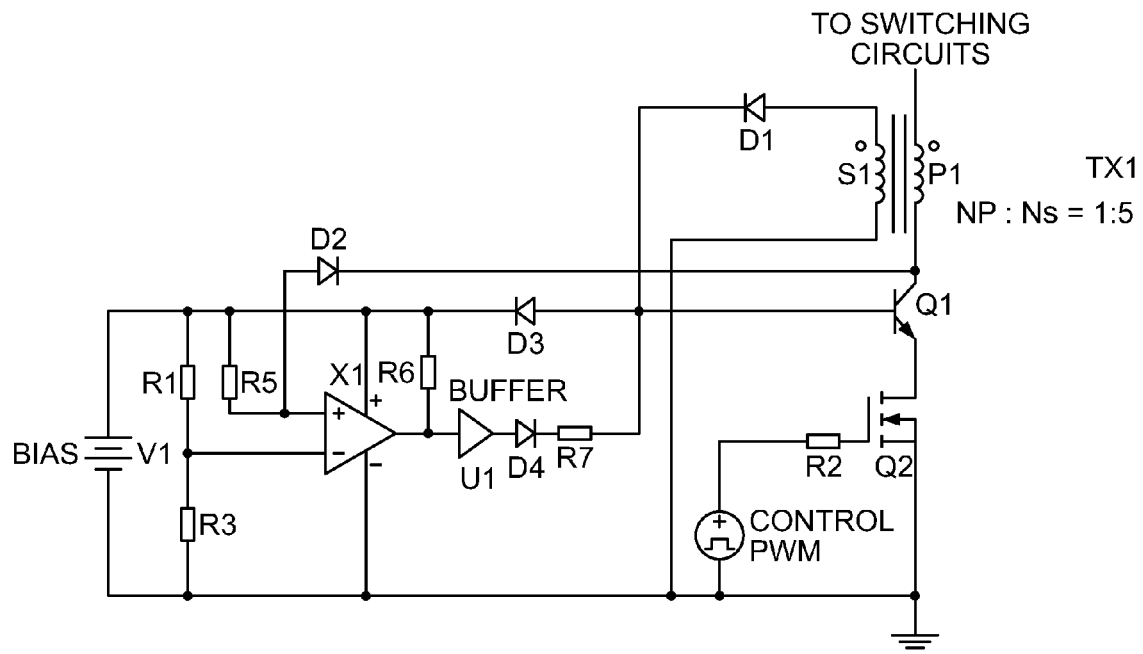

FIG. 8 is an example circuit having a current transformer to provide a proportional base drive current according to an aspect of the present disclosure.

Figure 9:
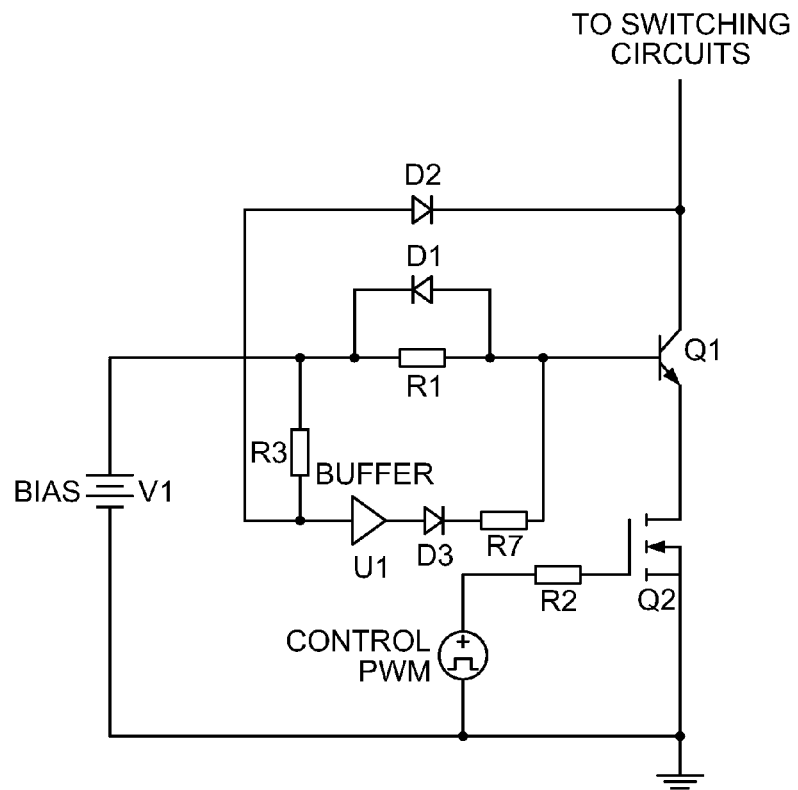

FIG. 9 is an example circuit having a collector voltage coupled directly to an input of a buffer according to an aspect of the present disclosure.

Figure 10:
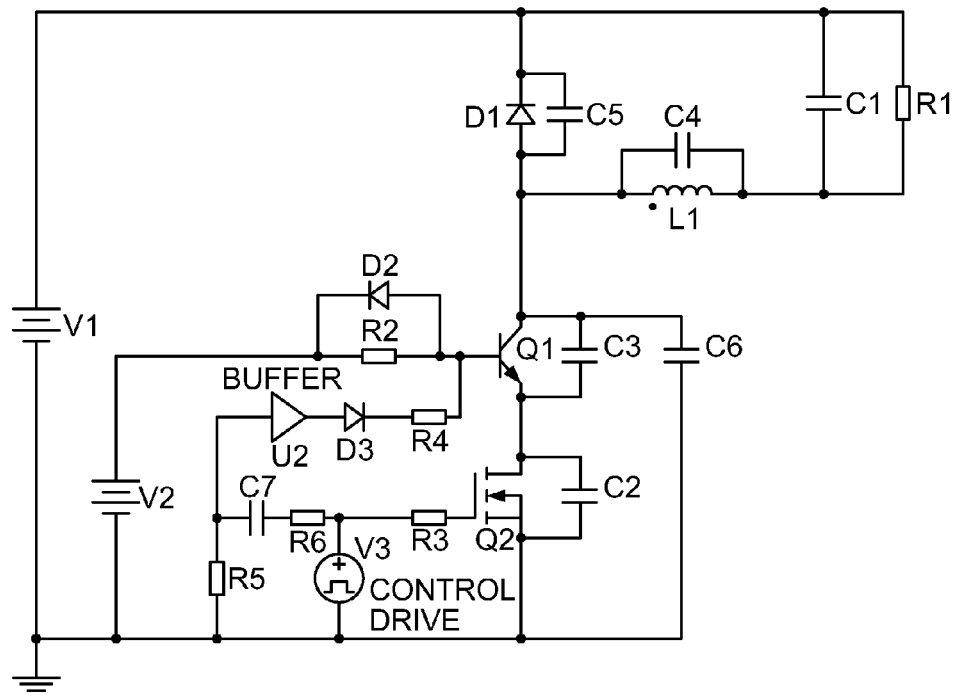

FIG. 10 is a block diagram of a power converter using an emitter switched bipolar transistor circuit according to an aspect of the present disclosure.

Figure 11:
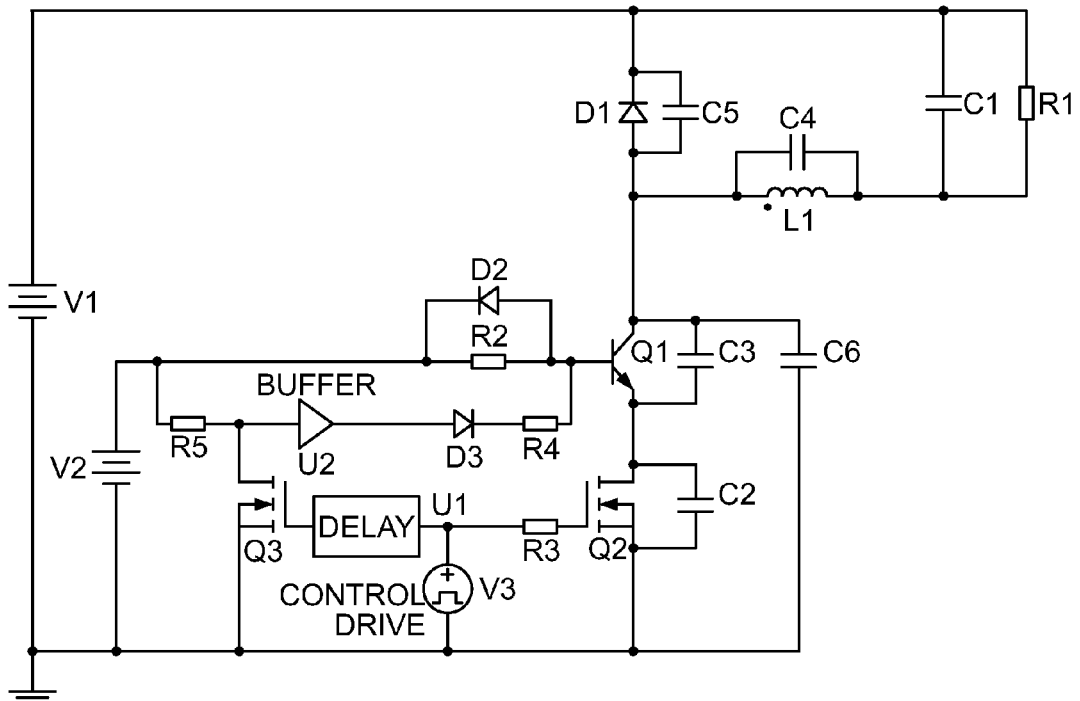

FIG. 11 is a block diagram of a power converter using an emitter switched bipolar transistor circuit having a fixed digital delay element according to an aspect of the present disclosure.

Corresponding reference numerals indicate corresponding parts throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail. \The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

According to one aspect of the present disclosure, a method of overdriving a base current of an emitter switched bipolar junction transistor (BJT) is provided. The BJT has a base, a collector and an emitter. The method includes supplying a current to the base of the BJT, monitoring a voltage of the collector, and reducing the current in response to the monitored voltage of the collector decreasing to a voltage threshold indicating the BJT is substantially saturated.

In some embodiments, a current may be provided to the base of the BJT from only one source (e.g., a bias supply voltage, buffer, current source, proportional current transformer, etc.) The current may be reduced upon detecting that the collector voltage has reached a voltage threshold. The voltage threshold may be selected to indicate that the BJT has substantially saturated once the collector voltage reaches the voltage threshold. For example, the voltage threshold may be the saturation voltage of the BJT. In other embodiments, a first current and a second current may be supplied to the base of the BJT. The first and second current may be supplied by different sources (e.g., a bias voltage supply and a buffer). The second current may be turned off in response to the monitored voltage of the collector decreasing to the voltage threshold.

The first current may be supplied to operate the BJT in normal on-state operation, and the value of the first current may be selected based on gain characteristics of the BJT. The first current may be supplied as long as the BJT is operating in an on-state (e.g., as long as a switch at the emitter of the BJT is turned on to allow current to flow at the emitter of the BJT, etc.). Once the BJT returns to an off-state (e.g., a switch at the emitter of the BJT is turned off to prevent current from flowing at the emitter of the BJT, etc.), the first current may be turned off.

The first current may be a fixed current. The fixed current may be provided by a bias voltage supply. Design parameters may be selected to set the value of the fixed current at a desired value for desired operation of the BJT during on-state operation. For example, a resistor may be connected between a bias supply and the base of the BJT. The value of the resistor may be selected to provide a desired fixed current value to the base of the BJT during on-time operation.

The first current may be proportional to a current through the collector. The first current may be proportional to a current through the collector to compensate for variation in the collector current during operation, which may reduce excessive base current at lower collector currents and improve efficiency. Collector current feedback may be used to adjust the value of the first current for driving the base of the BJT. For example, for smaller loads generating low collector current, the first current may be lower to provide a lower base drive to the BJT. For larger loads generating a higher collector current, the first current may be higher to provide a higher base drive to the BJT. In some embodiments, a current transformer may be coupled to the collector of the BJT to generate the proportional first current. The primary winding of the current transformer may be placed in series with the collector of the BJT, and the secondary winding of the current transformer may be coupled to the base of the BJT. The current gain ratio of collector current to base current may be selected based on the desired base drive for the BJT during on-time operation and device characteristics of the BJT. The turns ratio of the current transformer may be set to match the worst case gain of the BJT. In some embodiments, the current gain ratio of collector current to base current may be about five to one.

The second current may be a current injected to the base of the BJT to overdrive the base current for rapid saturation of the BJT. The value of the second current may be selected to provide a peak current sufficient to rapidly saturate the BJT. Higher levels of base current may create faster saturation of the BJT, but the base current preferably does not exceed the maximum allowable base current of the BJT. Once the BJT is substantially saturated, the second current may be turned off. The second current may be turned off while the first current is still being supplied. Therefore, the second current may be used to inject a peak current for a period of time until the BJT is substantially saturated, then the second current may be turned off while the first current is still supplied to provide a normal base drive current for on-time operation of the BJT after the BJT has been substantially saturated by the second current.

The second current may be supplied using a buffer receiving a bias voltage supply. The bias voltage supply for the buffer may be a same bias voltage supply used to provide the first current. Design parameters may be selected to set the value of the second current at a desired level to rapidly saturate the BJT. For example, a resistor may be connected between the base of the BJT and the buffer coupled to the bias voltage supply. The resistor value may be selected to provide the desired level of second current to the base of the BJT to rapidly saturate the BJT.

The voltage of the collector may be monitored by coupling the collector to a comparator, buffer, etc. The second current may be turned off in response to the monitored voltage of the collector decreasing to a voltage threshold indicating the BJT is substantially saturated. When the BJT is first turned on, the collector voltage may be at a high voltage due to coupling between the collector and other circuit elements. Once current starts to flow through the collector, the voltage at the collector may decrease. Once the voltage decreases to the voltage threshold, the second current may be turned off. The voltage threshold may be selected to indicate the BJT is substantially saturated. Once the voltage decreases to the voltage threshold, the BJT may be substantially saturated. For example, the voltage threshold may be approximately equal to the saturation voltage of the BJT.

The monitored voltage of the collector may be compared with a voltage reference. A comparator may be used to compare the monitored voltage with a voltage reference. The voltage reference may be generated from a bias voltage supply, and may be generated using a voltage divider coupled to the bias voltage supply. The voltage reference may be substantially similar to the voltage threshold, and may be substantially similar to the saturation voltage of the BJT. For example, the voltage divider may be designed to output a voltage reference to a comparator that is substantially equal to the saturation voltage of the BJT. The voltage of the collector may also be coupled to the comparator for monitoring. The comparator may be configured to output a control signal to a buffer to supply the second current while the collector voltage is above the voltage reference, and then turn off the second current once the collector voltage decreases to the voltage reference. Therefore, the second current may be provided until the collector voltage drops below the saturation voltage of the BJT, at which point the second current can be turned off because the BJT may be substantially saturated.

In other embodiments, the voltage of the collector may be coupled directly to a buffer, etc., having a voltage threshold which is approximately equal to the saturation voltage of the BJT. The buffer may be configured to supply the second current while the collector voltage is above the voltage threshold. Once the collector voltage decreases to the voltage threshold, the buffer will turn off the second current. Therefore, the buffer will supply the second current until the collector voltage decreases to the voltage threshold, at which point the second current can be turned off because the BJT may be substantially saturated.

According to the example methods described above, the second current may be adaptive such that it may only be supplied as long as needed until the BJT is substantially saturated. Once the BJT is substantially saturated, the second current may be turned off to avoid overdriving the base of the BJT beyond what is necessary to substantially saturate the BJT.

The method may also include recovering energy from the base of the BJT after the BJT is turned off. When the BJT is turned off, current may be generated at the base due to excess current in the collector. This excess current may be returned to a bias voltage supply to recover energy from the BJT after it is turned off. For example, a diode may be coupled between the base of the BJT and the bias voltage supply to recover the excess current generated when the BJT is turned off.

According to another aspect of the present disclosure, a method of overdriving a base current of an emitter switched BJT is provided. The BJT has a base, a collector and an emitter. The method includes supplying a first current to the base of the BJT, and supplying a second current to the base of the BJT for only a fixed period of time.

The first current may be supplied to operate the BJT in normal on-state operation. The second current may be a current injected to the base of the BJT to overdrive the base current for rapid saturation of the BJT. The second current may have a fixed amplitude and/or duration. The fixed amplitude and/or duration may be selected such that when the second current is injected for only the fixed period of time, the second current is sufficient to substantially saturate the BJT. The fixed period of time may be selected using design parameters to provide enough current to rapidly saturate the BJT. For example, the fixed period of time may be selected such that after second current has been supplied for the fixed period of time, the BJT is substantially saturated. The fixed period of time may be selected using experimentation, computation, etc.

A timer element may be used to supply the second current for the fixed period of time. The timer element may be a capacitor circuit having a charging time substantially similar to the fixed period of time. Therefore, the second current may be supplied for the fixed period of time until the capacitor charges up. Once the capacitor is charged, it may signal a buffer to turn off the second current. A fixed digital delay may be used to set the duration of fixed period of time. For example, a digital delay may receive a signal that the BJT is turning on. The digital delay may output a signal to a buffer to supply the second current to the base of the BJT. Once the fixed period of time is over, the digital delay may signal the buffer to turn off the second current.

It should be understood that any feature of the above example methods may be used with any other feature of the above example methods without departing from the scope of the present disclosure.

Some example circuits for practicing these methods will now be described with reference to FIGS. 5-11. It should be understood, however, that the methods are not limited to the example circuits described below, and the example circuits can be used to practice other methods in addition to or instead of the methods described above.

Figure 1:
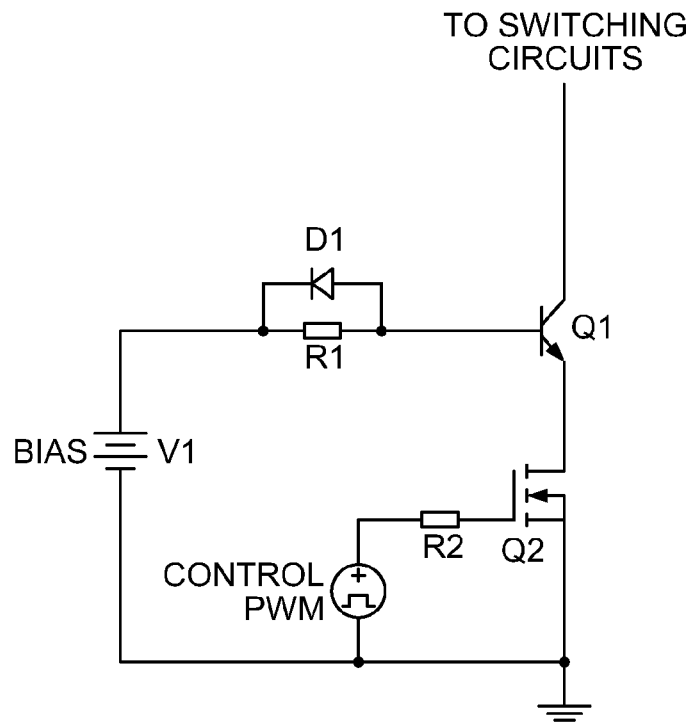
FIG. 1 is a block diagram of a prior art emitter switched bipolar transistor circuit.
Figure 2:
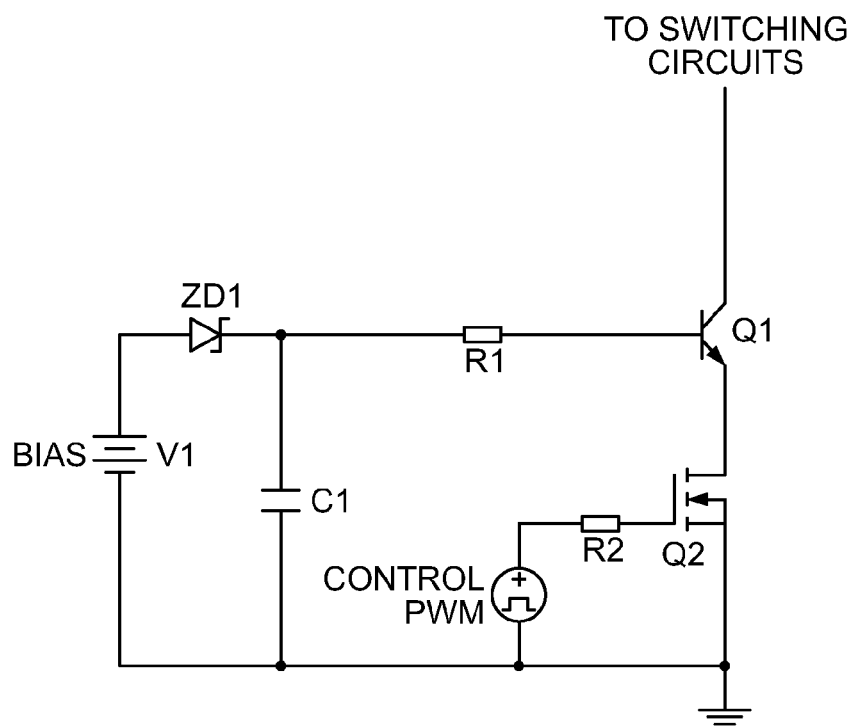
FIG. 2 is a block diagram of a prior art emitter switched bipolar transistor circuit having a capacitor to recover energy from the BJT.
Figure 3:
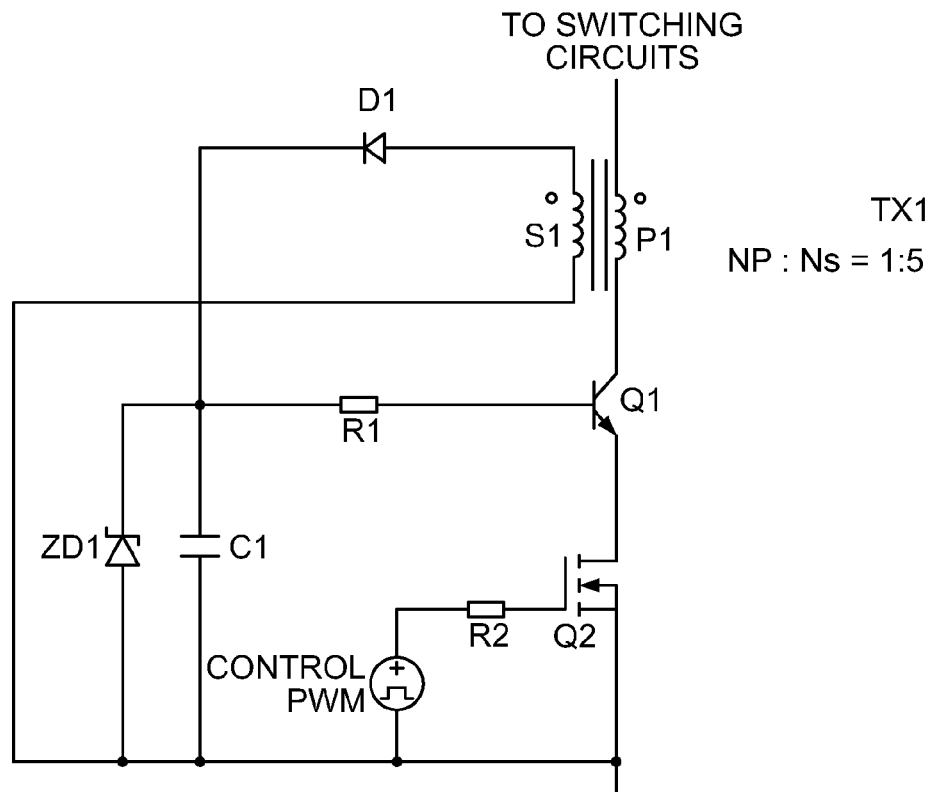
FIG. 3 is a block diagram of a prior art emitter switched bipolar transistor circuit having a current transformer to for supplying a proportional base drive current to the BJT.
Figure 4:
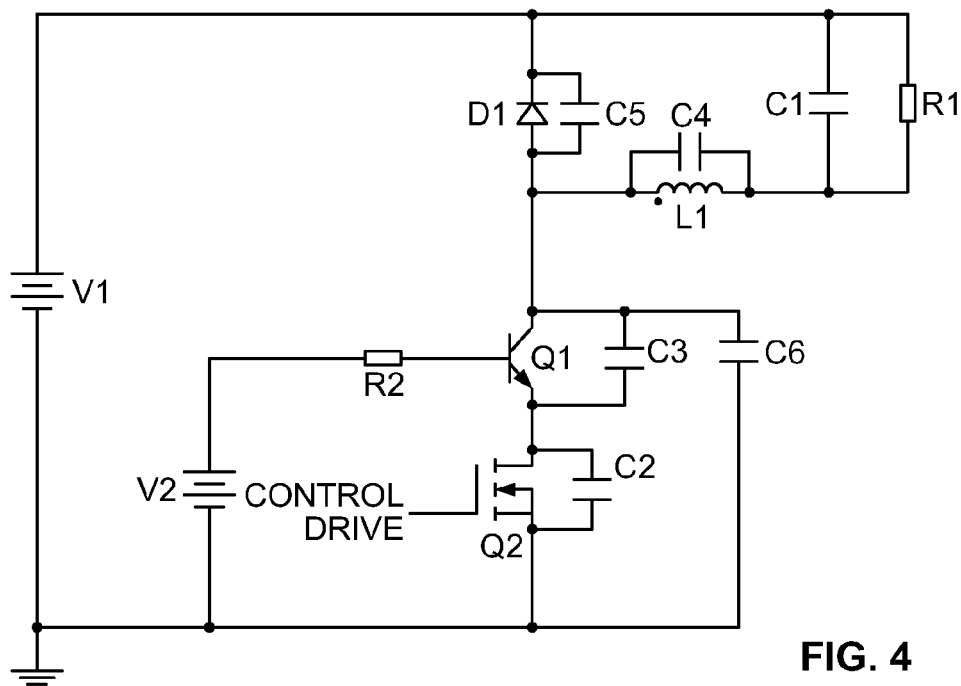
FIG. 4 is a block diagram of a prior art power converter using an emitter switched bipolar transistor circuit.
Figure 5:
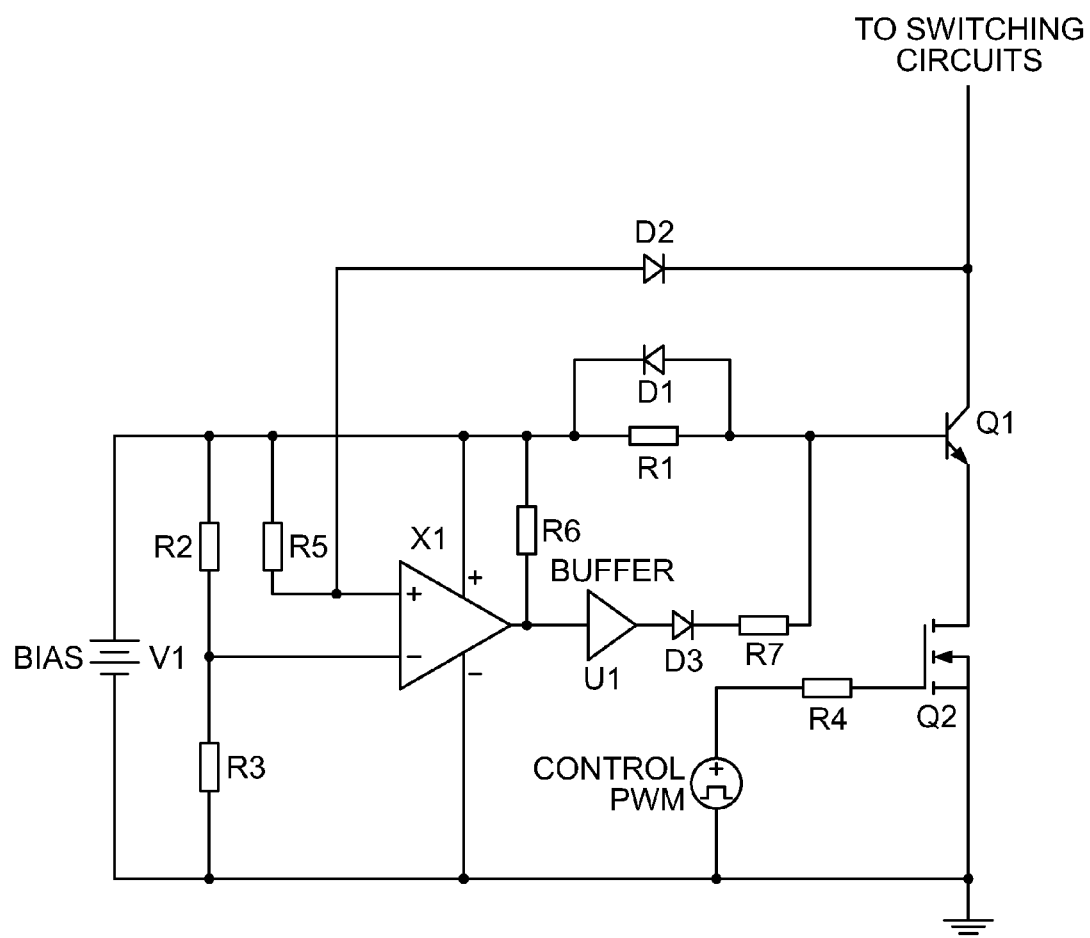
FIG. 5 is an example circuit for practicing a method according to an aspect of the present disclosure.

FIG. 5 illustrates an example circuit embodiment for practicing one or more example methods of the present disclosure. In this example embodiment, the emitter of a BJT Q1 can be coupled to metal oxide semiconductor field effect transistor (MOSFET) Q2 in an emitter switched bipolar transistor (ESBT) configuration. MOSFET Q2 may be turned on by applying a control pulse width modulated (PWM) through resistor R4. Before the MOSFET Q2 is turned on, the BJT Q1 may have a high collector voltage.

The collector voltage of BJT Q1 may be at a high voltage of an external circuit coupled to the collector of the BJT.

Comparator X1 may be coupled to the collector of BJT Q1 through diode D2. The comparator X1 may be configured to monitor the collector voltage of BJT Q1 and compare it with a fixed voltage reference. A fixed voltage reference may be set using resistors R2 and R3. The fixed voltage reference may be approximately equal to a desired BJT saturation voltage. Some BJTs have a saturation voltage below about 2V to 3V. Before MOSFET Q2 is turned on, the collector voltage may be high and diode D2 may be reverse biased. This may cause voltage at the non-inverting pin of comparator X1 to be higher than the fixed voltage reference coupled to the inverting pin of comparator X1. Therefore, the output of comparator X1 may be high before the MOSFET Q2 is turned on.

The output of comparator X1 may be coupled to a buffer U1. The buffer U1 may be used to provide driving capability to supply a second current to the base of the BJT Q1. When MOSFET Q2 turns on, buffer U1 may inject the second current to the base of the BJT Q1. If the bias voltage supply is fixed, the value of resistor R7 may determine the peak amplitude of the second current. The second current may be supplied to the base of the BJT Q1 at the same time as a first current is supplied by the bias voltage supply V1 and the resistor R1. If the bias voltage supply is fixed, the value of the first current may be determined by the value of resistor R1.

The second current may cause the BJT Q1 to saturate and cause the collector voltage to decrease rapidly. When the collector voltage decreases to a voltage threshold, the diode D2 may become forward biased and pull the non-inverting pin of the comparator X1 below the voltage reference coupled to the inverting pin of comparator X1. The output of the comparator X1 may go low, causing the buffer U1 to turn off the second current. Therefore, the second current may only be applied until the BJT Q1 achieves dynamic saturation based on sensing of the collector voltage. After the BJT Q1 becomes saturated and the second current is turned off, the first current may be maintained for BJT Q1 on-state operation. This example circuit embodiment may provide consistent BJT saturation levels and/or collector voltage fall times even with variations in BJT gains, temperature variations, etc.

When the PWM control drive signal goes low, the MOSFET Q2 may be rapidly turned off and the emitter current of Q1 may also be turned off very quickly. Extra base drive current may be removed by diverting collector current out of the base. The reverse base current may flow back to the bias voltage supply V1 through diode D1. If diode D1 has a low forward voltage drop, minimal energy may be lost and most of the stored energy from the BJT Q1 may be recovered by returning it to the bias voltage supply V1.

FIGS. 6A-C illustrate exploded wave forms of various currents and voltages of the example circuit embodiment illustrated in FIG. 5, during several cycles of operation of the example circuit. FIG. 6A illustrates a current at the base (IB) of the BJT Q1. FIG. 6B illustrates a voltage at the collector (VC) of the BJT Q1. FIG. 6C illustrates a current at the collector (IC) of the BJT Q1. As shown in FIGS. 6A-C, the collector voltage VC may oscillate prior to the turning on of the BJT Q1. Before the BJT Q1 is turned on, the base current IB and collector current IC may be about zero. After the BJT Q1 is turned on, a base current IB is injected to the base (e.g., IB1 in FIG. 6B). At this point, IB may consist of a combination of the first current and the second current being supplied to the base of the BJT Q1. This peak of the injected base current IB may be due to the second current supplied by buffer U1 to overdrive the BJT Q1. The peak base current IB causes the collector voltage VC to decrease rapidly. Once the collector voltage VC decreases to a saturation threshold, the second current may be turned off and IB may reduce back down to the level of the only the first supplied current (e.g., IB2 in FIG. 6B). Therefore, the second current may only be supplied to the base of the BJT Q1 until collector voltage decreases to a saturation threshold. While the BJT Q1 remains in normal on-time operation, the collector current IC may increase.

When the BJT Q1 is turned off, a reverse base current IB may be generated (e.g., IB3 in FIG. 6B). The reverse base collector current IB may have approximately the same amplitude as the collector current IC at the instance of BJT Q1 turn off. The reverse base collector current IB may be returned to the bias supply voltage V1. After the BJT switch Q1 is turned off, the collector voltage VC may return to a high voltage and the collector current IC and base current IB may return to about zero. The cycle may be repeated continuously at a frequency based on the turn on of the BJT Q1.

FIGS. 7A-C illustrate a single cycle of the waveforms of FIGS. 6A-C. FIGS. 7A-C more clearly illustrate that at turn on of BJT Q1, a peak base current IB (e.g., IB1 in FIG. 7B) may be supplied to the base of the BJT only until the collector voltage VC decreases to a saturation threshold. The peak base current IB may include a first and a second current during this period. Once the collector voltage VC decreases to the threshold value, the second current may be turned off and the base current IB may reduce to only the first current value (e.g., IB2 in FIG. 7B). When the BJT Q1 is turned off, the base current IB may have a reverse base current approximately equal to the collector current IC (e.g., IB3 in FIG. 7C). This reverse base current may be returned to the bias voltage supply V1 to recover energy.

FIG. 8 illustrates another example circuit embodiment for practicing one or more example methods of the present disclosure. As shown in FIG. 8, the first current may be proportional to a current at the collector. In this example embodiment, the first current is provided by the current transformer TX1, which is coupled to the collector of the BJT Q1. When the BJT Q1 is turned on, current may flow at the collector of the BJT. Primary winding P1 of current transformer TX1 may use the current flowing at the collector of the BJT Q1 to generate the first current at the secondary winding S1. The first current may be provided to the base of the BJT Q1 through diode D2.

A second current may be supplied to the base of the BJT Q1 by buffer U1 in a similar manner to the circuit of FIG. 5. Notably, any amount of second current provided by buffer U1 to the base of the BJT Q1 may induce additional collector current, which may generate an increased first current though the secondary winding of current transformer TX1. The resistor value R7 may be selected to compensate for an increased first current value due to the second current pulse.

When the control MOSFET Q2 is turned off using the PWM control signal, the collector current of the BJT Q1 may be diverted out of the base and the stored energy may be returned to the bias voltage supply V1 through diode D3. The regenerative energy returned back to the bias voltage supply V1 may be higher than the energy supplied by the bias voltage supply to generate the second current. This may increase the bias voltage supply level. However, many circuits may have a stiff bias voltage supply V1. If necessary, a zener diode clamp may be place across the bias voltage supply V1.

FIG. 9 illustrates another example circuit embodiment for practicing one or more example methods of the present disclosure. As shown in FIG. 9, the collector voltage may be coupled to the input of a buffer U1 through diode D2. The buffer U1 may be a logic gate. The bias voltage supply may be higher than the voltage threshold of buffer U1. When the input of the buffer U1 is pulled high using resistor R3 connected to the bias voltage supply V1, the output of the buffer may go high when BJT Q1 is turned on and the collector voltage of BJT Q1 is high and the diode D2 is reverse biased. When the collector voltage of BJT Q1 decreases to a saturation threshold, the diode D2 may become forward biased and cause the input of buffer U1 to fall below its voltage threshold. This may turn off the second current. The voltage threshold may be approximately equal to a desired saturation voltage of the BJT Q1. Some standard 3.3V or 5V logic gates may have low thresholds that are compatible with saturation voltage thresholds of BJTs.

FIG. 10 illustrates another example circuit embodiment for practicing one or more example methods of the present disclosure. As shown in FIG. 10, the example circuit may be a power converter configured to operate in a continuous current mode (CCM), a discontinuous current mode (DCM), a boundary current mode (BCM), etc. In the CCM mode, a current through the inductor L1 may never reduce to zero during any point of the switching cycle. In the DCM mode, a current through inductor L1 may be reduced to zero and remain at zero for periods of the switching cycle. In the BCM mode, a current through the inductor L1 may be reduced to zero but not remain at zero and instead immediately increase after reaching zero.

In this example circuit, a first current may be supplied to the base of BJT Q1 by bias voltage supply V2. A second current may be supplied for a fixed period of time by buffer U2. The fixed period of time may be predetermined as a period of time sufficient to cause the BJT Q1 to become substantially saturated. The fixed period of time may be based on experimentation, computation, etc. When the control drive V3 turns on MOSFET Q2, it may also apply a high input signal to buffer U2 through capacitor C7. This may cause the buffer to output a second current to the base of the BJT Q1, based on the value of resistor R4. During a fixed period of time, the capacitor C7 may charge such that the buffer input may fall below the buffer U2 input threshold. This may cause the buffer U2 to turn off the second current. The first current may continue to be supplied to the base of the BJT Q1 after the second current is turned off. A desired fixed time period may be selected by adjusting the parameter values of resistor R5, resistor R6 and capacitor C7.

FIG. 11 illustrates another example circuit embodiment for practicing one or more example methods of the present disclosure. The first and second currents may be provided to the base of BJT Q1 in a similar manner to the example circuit of FIG. 10. In this example circuit, the fixed period of time may be determined by a fixed digital delay element. When a control drive signal V3 turns on MOSFET Q2, the buffer U2 may provide a second current to the base of the BJT Q1 because its input may be high due to coupling to the bias voltage supply V2 through resistor R5. Once the fixed amount of time has passed, the fixed digital delay element may switch MOSFET Q3 to pull the input of buffer U2 low to turn off the second current.

The various example methods and circuit embodiments may be used in any suitable application, such as, for example, high voltage input power converters using cascode switches (e.g., emitter switched bipolar transistors), low power adapters, chargers, bias converters, three phase input flyback converters, etc.

The various example methods and circuit embodiments may provide one or more advantages, such as, for example, using active devices to eliminate the use of capacitors, implementing the circuit as an integrated circuit, increasing the recovering of stored energy from the base of the BJT during turn off for regenerative usage, providing controlled overdrive current for rapid turn on, adapting the level of overdrive to an appropriate duration based on characteristics of the BJT such as gain and temperature, and/or providing an accurate amount of peak base current for only an amount of time necessary to substantially saturate the BJT.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A power converter control circuit comprising:
   a bipolar junction transistor (BJT) having a base, a collector and an emitter;
   a metal oxide semiconductor field effect transistor (MOSFET) coupled to the emitter;
   a bias voltage supply coupled to the base;
   a buffer coupled to the base;
   a controller coupled to the gate of the MOSFET, the controller configured to apply a pulse width modulated (PWM) signal to control the MOSFET; and
   a timer element coupled between the controller and an input of the buffer, the timer element configured to, in response to receiving a control signal from the controller to turn on the MOSFET, cause the buffer to inject a current pulse to the base for a fixed period of time, the fixed period of time selected such that the current pulse will substantially saturate the BJT.

2. The power converter control circuit of claim 1, wherein the timer element comprises a capacitor, the capacitor configured to charge in a time approximately equal to the fixed period of time after receiving the control signal from the controller to turn on the MOSFET.

3. The power converter control circuit of claim 1, further comprising a buffer timing control switch coupled to the input of the buffer, wherein the timer element comprises a fixed digital delay element coupled to the gate of the buffer timing control switch, the fixed digital delay element configured to operate the switch to cause the buffer to inject the current pulse to the base for the fixed period of time after receiving the control signal from the controller to turn on the MOSFET.

4. The power converter control circuit of claim 3, further comprising a diode coupled between the base and the bias voltage supply to allow stored energy to return to the bias voltage supply from the base of the BJT after the BJT is switched off.

5. The power converter control circuit of claim 1, further comprising a diode coupled between the base and the bias voltage supply to allow stored energy to return to the bias voltage supply from the base of the BJT after the BJT is switched off.

6. The power converter control circuit of claim 2, further comprising a buffer timing control switch coupled to the input of the buffer, wherein the timer element comprises a fixed digital delay element coupled to the gate of the buffer timing control switch, the fixed digital delay element configured to operate the switch to cause the buffer to inject the current pulse to the base for the fixed period of time after receiving the control signal from the controller to turn on the MOSFET.

7. The power converter control circuit of claim 6, further comprising a diode coupled between the base and the bias voltage supply to allow stored energy to return to the bias voltage supply from the base of the BJT after the BJT is switched off.

* * * * *